Dec. 16, 1958 F. H. DRAKE 2,864,942
RECEIVER TUNING IN TWO-WAY RADIO
Filed March 11, 1955
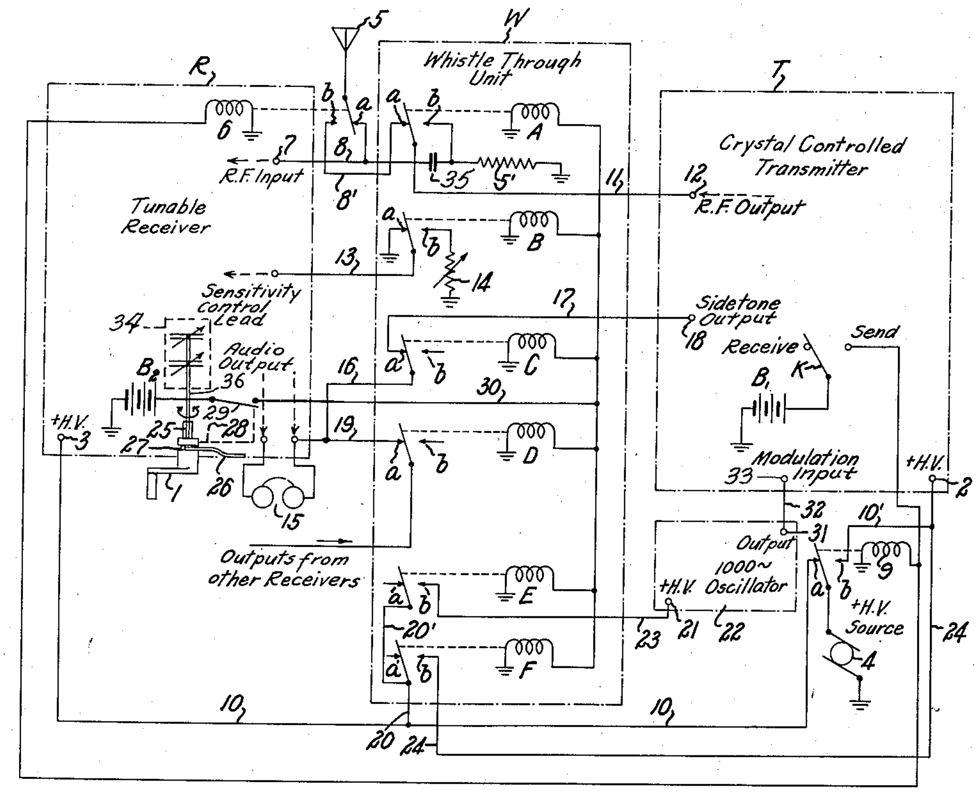
INVENTOR:
Frederick H. Drake,
BY Pierce, Scheffler & Parker,
ATTORNEYS.

United States Patent Office 2,864,942

Patented Dec. 16, 1958

2,864,942

RECEIVER TUNING IN TWO-WAY RADIO

Frederick H. Drake, Boonton, N. J., assignor to Aircraft Radio Corporation, Boonton, N. J., a corporation of New Jersey Application March 11, 1955, Serial No. 493,687

7 Claims. (Cl. 250—13)

This invention relates to receiver tuning in two-way radio communication systems and more particularly to the manual tuning of a receiver associated with a crystal-controlled transmitter on an aircraft for "simplex" operation, i. e. for transmission and reception on the same frequency.

Continuously tunable receivers on aircraft are usually installed at some point removed from the aircraft control panel, with the receiver gang condenser manually rotated remotely through gear trains and a flexible shaft by a tuning crank in a control unit mounted on the control panel. These installations are very satisfactory for navigation receivers since the desired signal is being transmitted continuously and is always available for tuning the receiver to aural maximum in the headphones. For communication purposes, however, manually tuned receivers are not, without supplemental equipment, very satisfactory under many circumstances since the desired signal is not continuously available for tuning purposes and entire messages may be lost because the receiver can not always be tuned with sufficient accuracy by the frequency calibration on the dial of the control unit to insure satisfactory reception.

To remedy this defect when operating simplex with a crystal-controlled transmitter it has been proposed to employ "whistle-through" tuning for adjustment of the receiver. Basically, "whistle-through" tuning requires additional electrical equipment by which the operator, whenever he desires, presents to the receiver input a signal from the transmitter which is suitable for tuning purposes. Thus the dependence for tuning purposes upon the intermittent desired signal is eliminated and the manually tunable receiver, with its reliability and efficiency becomes, for many communication purposes, a device superior to conventional more complicated and heavy receivers of "push-button" controlled type.

The prior arrangements for "whistle-through" tuning have been open to the objection that two hands were required for their operation as it was necessary to hold down the switch or button which established the "whistle-through" condition while turning the tuning element with the other hand. The hold-down-to-operate control was essential to eliminate the possibility that the operator might inadvertently leave the communication system in the "whistle-through" condition in which outside signals could not be received. Two-handed tuning operations are not practical, however, in some types of military aircraft, for example, in helicopters.

Objects of the present invention are to provide a one-handed tuning control in a two-way communication system of the type comprising a manually tuned radio receiver associated with a crystal controlled transmitter. An object is to provide a tuning control for a communication system comprising a tunable receiver and a crystal-controlled transmitter which are normally energized in alternation; the control including a receiver tuning crank which may be held in for simultaneous energization of both units, whereby the transmitter supplies a signal to the receiver for tuning purposes, and the units returning automatically to normal alternative energization upon release of the tuning crank. More specifically an object is to provide a tuning control of the type last stated in which the holding in of the receiver tuning crank, when the system is adjusted for reception, automatically energizes the transmitter, modulates its output and imposes it upon a dummy load which is loosely coupled to the receiver input terminal, reduces the sensitivity of the receiver so that it will not pick up outside signals, and disconnects the headphones from any other receivers which may be in the aircraft.

These and other objects and the advantages of the invention will be apparent from the following specification when taken with the accompanying drawing in which the single view is a schematic diagram of an embodiment of the invention.

In the drawing, the dotted line rectangle T indicates a crystal-controlled transmitter of conventional or desired construction which, due to the crystal control operates on a fixed carrier frequency, and the rectangle R indicates a radio receiver that is manually tunable by a crank 1 over a range which includes the frequency of the transmitter T. The transmitter and receiver have high voltage terminals 2, 3 respectively upon which energizing potentials are impressed from a high voltage direct current source which is shown schematically as a motor generator 4. A common antenna 5 is provided for the transmitter and receiver and, as is conventional in simplex communication systems, only the transmitter or the receiver is normally conditioned for operation at any one time. As shown schematically, the receiver is normally in condition for operation as the movable blade of the antenna relay 6 is in rest position against its back contact *a* which is connected to the receiver input terminal 7 by a lead 8, and the movable blade of relay 9 is in rest position against its back contact *a* to connect the high voltage source 4 to the high voltage terminal 3 of receiver R through a lead 10. To condition the apparatus for transmission, the operator shifts a key K in transmitter T from its illustrated position in engagement with the "Receive" contact to the "Send" contact and this energizes the relays 6 and 9 from a current source $B_1$ to move the respective movable blade contacts to the associated front contacts *b*, thereby connecting the antenna 5 through lead 8′ to the back contact *a* of relay A of the "whistle-through" unit W of the communication system. The movable blade of relay A is connected by lead 11 to the output terminal 12 of transmitter T, and the energization of antenna relay 6 thus shifts the antenna 5 from the receiver to the transmitter. At the same time the energization of relay 9 removes the high voltage from the anode circuits of receiver R and impresses it upon the anode circuits of the transmitter by shifting the movable blade of relay 9 from back contact *a* to front contact *b* which is connected to the transmitter high voltage terminal 2 by lead 10′.

In accordance with the invention the whistle-through unit W comprises a plurality of relays A–F which may be simultaneously energized, as will be described later, from a current source, shown schematically as a battery $B_2$ which may be and preferably is, the same low voltage source $B_1$ which is employed for energizing the relays 6 and 9. The front contact *b* of relay A is connected to a dummy load 5′ which is loosely coupled to the receiver input lead 8 by a small condenser 35. A sensitivity control lead 13 from the receiver is connected to the grounded back contact *a* of relay B, and the associated front contact *b* is connected to ground through a resistance 14 which, as shown schematically, is adjusted to reduce the receiver sensitivity to a desired degree. The movable blade of relay C is connected to the receiver headphones 15 by a lead 16, the back contact *a* of this relay is connected by a lead 17 to the transmitter terminal 18 on which the transmitter sidetone is impressed, and the associated front contact *b* is open. When the aircraft is provided with other receivers, their outputs are impressed on the headphones 15 of the tunable receiver R through the blade of relay D which has an open front contact *b* and a back contact *a* connected by a lead 19 to the headphones 15 in parallel with the audio output circuit of the receiver R. The movable blades of relays E and F are connected to the high voltage receiver lead 10 by jumpers 20 and 20'. These relays have open back contacts *a* and front contacts *b* connected respectively to the high voltage terminal 21 of a 1000 cycle oscillator 22 by a lead 23 and to the high voltage lead 10' of the transmitter T by a lead 24.

The receiver tuning crank 1 is axially slidable on the splined end 25 of the tuning shaft 36 which extends to the adjustable frequency-determining elements of the receiver, shown as ganged condensers, 34, and is normally held in forward position by appropriate spring means such as a leaf spring 26 having an end seated in a circumferential groove 27 of the tuning crank.

The tuning crank 1 has an extension, indicated schematically by the dotted line 28, which engages and closes a switch 29 when the crank is pressed inwardly against the force exerted by the sppring 26. The switch 29 is in series with the current source $B_2$ and the common lead 30 of the relays A–F of the whistle-through unit.

The output terminal 31 of oscillator 22 is connected by a jumper 32 to the external modulation terminal 33 of the transmitter T.

The key K of the transmitter must be o[illegible] [illegible]eive" contact to energize the receiver R when it [illegible] [illegible]uned to the frequency of the transmitter T. The opera[illegible] then presses the tuning crank 1 in to close the switch 29 and turns the crank, if necessary, until a 1000 cycle note is heard in the headphones 15. The closure of switch 29 energizes relays A–F simultaneously and the resultant shifting of their movable blades to their front contacts establishes a transmitter-produced signal at the receiver for tuning and simultaneously blocks the reception of any external signals, as follows:

Relay A transfers the transmitter R. F. output to the dummy load 5' which is loosely coupled to the receiver input.

Relay B inserts the resistance 14 into the sensitivity control circuit of the receiver to reduce its sensitivity to such value that it will not pick up external signals arriving at the antenna 5.

Relay C removes the normal transmitter sidetone output from the receiver headphones 15.

Relay D removes the outputs from any other receivers from the headphones.

Relay E energizes the 1000 cycle oscillator to impose a modulation on the transmitter output.

Relay F applies the high voltage to the transmitter anode circuits.

Both the receiver and transmitter are thus simultaneously energized so long as the operator holds the tuning crank displaced in opposition to the spring 26. The R. F. output from the transmitter, modulated at 1000 cycles by oscillator 22, and attenuated by resistor 5' and condenser 35, passes into the desensitized receiver including tuning elements 34 adjusted by crank 1. When the receiver is tuned to the transmitter carrier frequency, the demodulated 1000-cycle frequency passes through the "Audio Output" circuit of the receiver to headphones 15, which are now disconnected from the sidetone line 17 and the outputs from other receivers, if any. The operator of course releases the tuning crank as soon as he has so adjusted the receiver tuning that the 1000-cycle note or whistle is heard in the headphones. Switch 29 is immediately opened since the spring 26 returns the tuning crank to normal outward position, thereby deenergizing the relays A–F and restoring the communication system to normal "Receive" condition. Spring 26 makes it impossible for the operator to leave the apparatus in tuning condition which would prevent normal transmission and/or reception, but only one hand is required for tuning the receiver accurately to the stabilized transmitter carrier frequency.

In conclusion, it will be understood that various changes in the specific construction and arrangement illustrated may be made without departing from the spirit and scope of the invention as defined in the appended claims. Thus, for example, while headphones have been shown, these can be replaced with any equivalent electroacoustic transducer, such as a loudspeaker, and which is therefore defined generally in the claims as an aural receiver.

I claim:

1. The combination with a two-way simplex radio communication system comprising a crystal-controlled transmitter operating on a fixed carrier frequency and a tunable radio receiver having an angularly movable crank on motion-transmitting means extending to the adjustable frequency-determining elements of the receiver; of means supporting said crank for movement between two end positions with respect to said motion-transmitting means, said crank being operative to move said motion-transmitting means angularly in all positions of adjustment of said crank with respect to said motion-transmitting means, tuning-facilitating means operative upon movement of said crank to one of its end positions to impress upon said receiver a transmitter-produced signal for tuning purposes, and spring means normaly retaining said crank in its other end position, thereby to remove said transmitter-produced signal from said receiver.

2. The invention as recited in claim 1, wherein said radio receiver includes an aural receiver connected to its audio output circuit and means impressing the transmitter sidetone upon said aural receiver when said transmitter is modulated for transmission to an external station, and wherein said tuning-facilitating means includes an audio-frequency oscillator which modulates said transmitter upon the movement of said crank to one of said end positions.

3. The invention as recited in claim 2, wherein said communication system includes relay means normally energizing said radio receiver and said transmiter in alternation for reception from and transmission to an external station, respectively, and wherein said tuning-facilitating means removes said sidetone from said aural receiver when said audio-frequency oscillator modulates said transmitter.

4. The invention as recited in claim 3, wherein said communication system includes a single antenna, and said relay means connects said single antenna in alternation to said receiver or said transmitter, and wherein said tuning-facilitating means disconnects said antenna from said radio receiver, when said audio oscillator modulates said transmitter and simultaneously reduces the radio receiver sensitivity and switches the modulated radio-frequency transmitter output through attenuating means to the radio-frequency input circuit of said radio receiver.

5. The invention as recited in claim 3, wherein said tuning-facilitating means includes means for energizing and automatically modulating said transmitter when said relay means adjusts said communication system for reception.

6. The invention as recited in claim 2, wherein the output of another radio receiver is connected in parallel with said aural receiver, and wherein said tuning-facilitating means disconnects the output of said other radio receiver from said aural receiver.

7. In combination, a radio receiver wherein the desired signal from an external station is selected by adjustment of a continuously-rotatable crank, a radio transmitter whose emitted carrier frequency is determined by a crystal-controlled oscillator, relay means whereby said receiver and transmitter are normally operated alternatively, but not simultaneously, and additional means for operating both together and simultaneously tone-modulating said transmitter, said additional means being actuated by a switch which is mechanically coupled to said crank.

References Cited in the file of this patent

UNITED STATES PATENTS

| | | |
|---|---|---|
| 1,940,881 | Ports | Dec. 26, 1933 |
| 1,973,298 | Sloggett et al. | Sept. 11, 1934 |
| 2,166,532 | Naden | July 18, 1939 |
| 2,369,193 | Vrooman | Feb. 13, 1945 |
| 2,409,845 | Gardiner et al. | Oct. 22, 1946 |
| 2,411,891 | Owens | Dec. 3, 1946 |
| 2,469,539 | Abbott et al. | May 10, 1949 |
| 2,539,537 | Harley et al. | Jan. 30, 1951 |
| 2,671,166 | O'Brien | Mar. 2, 1954 |
| 2,679,580 | Ware | May 25, 1954 |
| 2,684,437 | Reiss | July 20, 1954 |